United States Patent [19]

Welzhofer

[11] Patent Number: 4,488,062
[45] Date of Patent: Dec. 11, 1984

[54] PULSE SHAPER

[75] Inventor: Klaus Welzhofer, Graefelfing, Fed. Rep. of Germany

[73] Assignee: Siemens Aktiengesellschaft, Berlin & Munich, Fed. Rep. of Germany

[21] Appl. No.: 443,575

[22] Filed: Nov. 22, 1982

Related U.S. Application Data

[63] Continuation of Ser. No. 204,706, Nov. 6, 1980, abandoned.

[30] Foreign Application Priority Data

Dec. 21, 1979 [DE] Fed. Rep. of Germany ....... 2951930

[51] Int. Cl.³ .......................... H03K 5/08; H03K 5/12
[52] U.S. Cl. .................................. 307/268; 307/246; 307/263
[58] Field of Search ............... 307/246, 268, 262, 264, 307/263; 328/59, 60, 61, 67, 183, 185

[56] References Cited

U.S. PATENT DOCUMENTS 4,083,036 4/1978 Bahlmann et al. .................. 307/268

FOREIGN PATENT DOCUMENTS 1933184 1/1971 Fed. Rep. of Germany .

Primary Examiner—John Zazworsky
Attorney, Agent, or Firm—Hill, Van Santen, Steadman & Simpson

[57] ABSTRACT

A pulse shaper has a periodically reversible capacitor for pulse shaping. In performing testing of electronic components, the test specimens must be driven with different or, respectively, variable pulses. To this end, the pulse shaper has two mutually symmetrical circuits serving for the periodic charging and discharging of the capacitor, the circuits respectively containing binarily switched adjustable resistors for setting the rise time and fall time of the pulse edges of the pulses to be formed, as well as containing a current source and a voltage source for the proportional change of the edge steepness with respect to the change of the shift of the pulses. In addition, voltage limitation is provided to generate the desired amplitude shift with respect to the baseline voltage with structure assigned to each circuit, the bias voltage sources of such structure being variable as a function of the shift to be set. The charging and discharging occurs by way of a periodically switched differential switch respectively comprising two transistors. The pulse shaper of the invention is particularly suited for automatic testing units for data processing devices.

12 Claims, 4 Drawing Figures

FLIP-FLOP MEMORY

PULSE SHAPER

This is a continuation of application Ser. No. 204,706, filed Nov. 6, 1980, now abandoned.

BACKGROUND OF THE INVENTION

1. Field of the Invention

The present invention relates to a pulse shaper which has a periodically reversible capacitor for the pulse shaping function.

2. Description of the Prior Art

In performance testing of electronic components, the test specimens must be driven with different or, respectively, variable pulses. It is therefore necessary to incorporate pulse shapers in the corresponding automatic testing units, the pulse shapers having output pulses which can be adapted to the required individual test conditions as close to practice as possible and in a programmable manner. In known pulse shapers, the edge rise times change given programming of shift and base voltages.

SUMMARY OF THE INVENTION

The object of the present invention is to provide a pulse shaper for generating pre-programmable pulses whose parameters are freely selectable and can be adjusted non-reactive with respect to one another.

In order to achieve the above object, a pulse shaper constructed in accordance with the present invention is designed in such a manner that two mutually symmetrical circuits, serving for the periodic charge and discharge, are provided, the symmetrical circuits respectively containing binarilly switched, adjustable resistors for setting the rise or, respectively, fall times of the pulse edges of the pulses to be formed, as well as containing a current source and a voltage source for the proportional change of the edge steepness with the change of the shift of the pulses. Moreover, a structure for voltage limitation which generates the desired shift is assigned to each circuit, the bias voltage sources of such structure being variable as a function of the shift to be generated. The charge and discharge occurs via periodically-operated differential switches respectively comprising two transistors.

By the above features, one obtains a pulse circuit in which the generated pulses can be adjusted at random both as to their base voltages as well as to their shift and with respect to their rise and fall times at the leading and trailing edges.

Further, it is advantageous that the binarilly switched resistors are realized by digital/analog converters which evaluate the data parameters input via a data bus and memory for the chronological rise and fall of the pulse edges. The shift and base voltages, which are likewise supplied via bus lines to a respective digital-/analog converter via a memory, are loaded at their output side with ohmic resistors at which voltages proportional to the output currents arise, the voltages respectively serving as control voltages for the non-inverting inputs of two first operational amplifiers, below referenced OP1 and OP8.

By employing analog computers, a simple programmability is guaranteed for the pulse shape required for the respective case with simple manipulation.

Further, the invention can be described in such a manner that the operational amplifier assigned to the digital/analog converter for the shift voltage, together with a transistor connected at its output, forms a voltage source; and that an ohmic resistor is connected between the output of this source and the output of the operational amplifier post-connected to the digital/analog converter for the pulse base voltage.

By so doing, it is achieved that the programmed shift voltage always remains constant relative to the base voltage setting.

For the purpose of adding the shift voltage to the base voltage, the output of the current source post-connected to the digital/analog converter for the shift voltage has the control input of a further operational amplifier connected thereto, the inverting input of the further operational amplifier being connected to its output and its output being connected to a diagonal point of a Wheatstone bridge, whereas the output of the operational amplifier for the base voltage is fed to the other diagonal point of the Wheatstone bridge.

In order to always have symmetrical voltages which change in the same tendency available for the individual controls in the charge and discharge circuit, the Wheatstone bridge is constructed with a voltage divider in each of its branches.

Advantageously, the voltage sources in the charge and discharge circuits are designed as emitter followers which are formed by third operational amplifiers having respective transistors connected to their outputs, their control inputs being respectively connected to the tap of the voltage dividers located in the bridge branches lying obliquely opposite.

It is likewise advantageous that the current sources are formed by fourth operational amplifiers with respective transistors connected to their outputs and that the control inputs of these operational amplifiers are connected to the taps of the voltage divider of those further remaining bridge branches of the Wheatstone bridges lying obliquely opposite.

A further expedient embodiment provides that the limiter elements are Zener diodes and that their voltage sources are likewise fifth operational amplifiers having transistors connected to their outputs as emitter followers. The control inputs of these operational amplifiers are connected to the tap of the voltage dividers which lie between the emitter of the transistors of the current sources and a respective point of the bridge diagonals of the Wheatstone bridge.

The differential switches can be designed in such a manner that the two transistors forming a differential switch are respectively of the same conductivity, but nonetheless, of the complementary conductivity type with respect to the switches. The collectors of one respective transistor of each switch and the emitters of the two transistors belonging to one switch are connected to one another. The collectors of those transistors which still remain are directly connected to their voltage sources while by-passing the limiter elements.

By employing the above techniques, non-linear edge forms are avoided.

The memories connected to the inputs of the digital-/analog converters can be designed as flip-flop memories.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
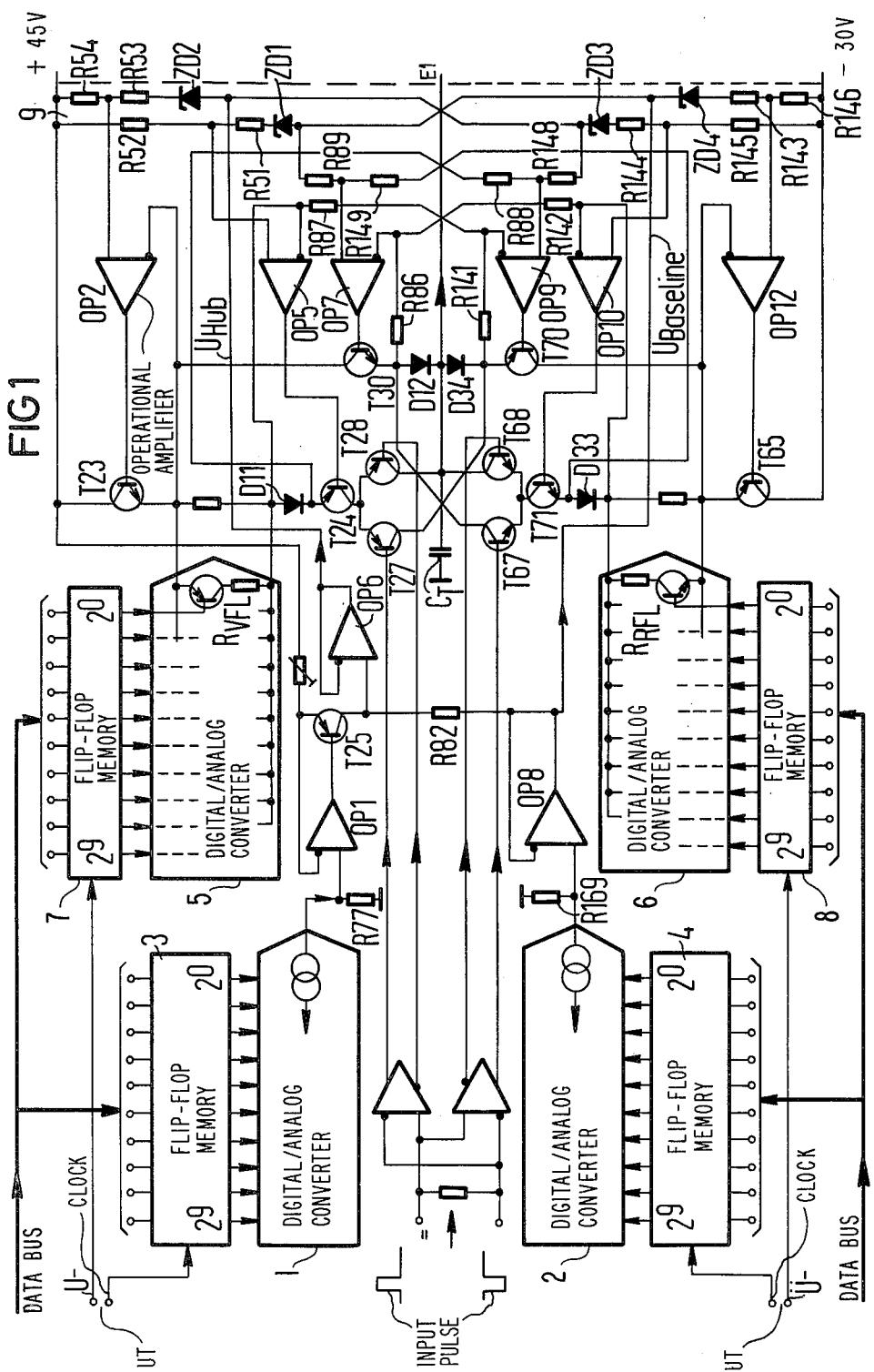
FIG. 1 is a simplified block diagram of a pulse shaper constructed in accordance with the present invention.

A simplified block diagram is illustrated in FIG. 1 in which the structure and the operation of the pulse shaper are set forth. The data for the baseline pulse voltage, the voltage amplitude, and the rise and fall times for the leading and trailing edges of the pulses arrive over a data bus DAB at preparation inputs of flip-flop memories 3, 4, 7 and 8. Four mutually-independent transfer clocks UT load the data into the corresponding flip-flop memories. The outputs of the flip-flop memories 3, 4, 7 and 8 respectively drive a digital/analog converter 1, 2, 5 and 6, whereby the digital/analog converters 1 and 2, for generating the amplitude and the base line pulse voltage generate respective binarily-graduated constant currents at their outputs and the digital/analog converters 5 and 6 determine the rise and fall times for the leading and trailing edges of the pulse.

With the assistance of a resistor R169, a current-proportional voltage amplitude is generated at the output of the digital/analog converter 2, the voltage amplitude being supplied to an operational amplifier OP8. The base line voltage is emitted at the output of the operational amplifier OP8, which serves as an impedance converter.

A current-proportional voltage likewise arises at a resistor R77 which is disposed at the output of the digital/analog converter 1, the voltage controlling a constant current source comprising an operational amplifier OP1 and a transistor T25.

The constant current generated at the collector of the transistor T25 flows through a resistor R82. Since the resistor R82 is connected at one side with the line for the base line voltage, its voltage drop is added, floating with respect to the base line voltage. An operational amplifier OP6, which is likewise connected as an impedance converter, senses this voltage and forms the amplitude voltage therefrom. By way of this circuit arrangement it is achieved that the programmed amplitude voltage always remains constant relative to the baseline voltage, i.e. when the baseline voltage changes, then the amplitude voltage also changes absolutely by the same amount.

By way of a pair of Zener diodes ZD4/DZ3 or ZD2/ZD1, the base line voltage is applied to a Wheatstone bridge 9 comprising a plurality of resistors R51, R52/R53, R54 and R144, R145/R143, R146.

Figure 2:
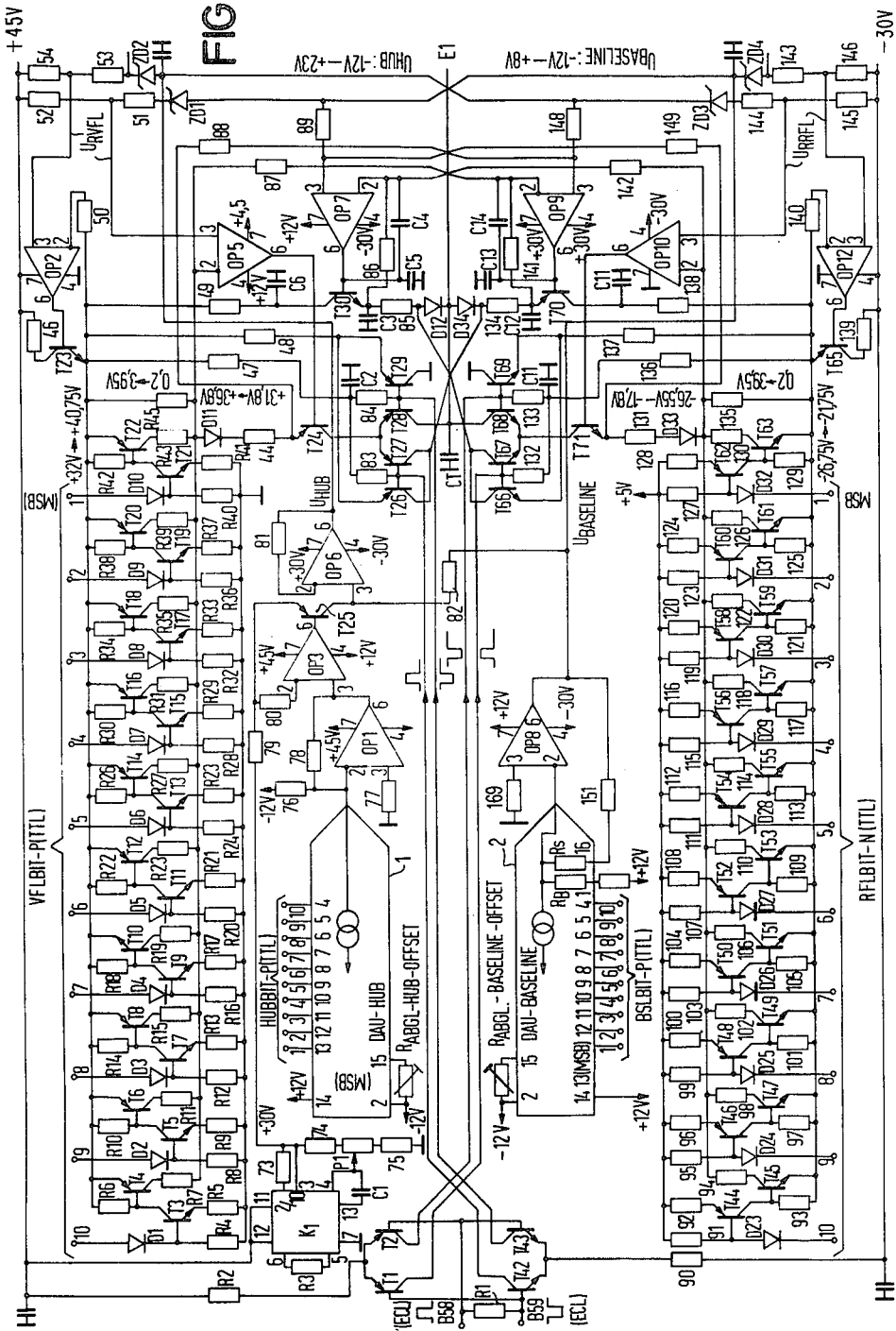
FIG. 2 is a complete schematic diagram of the pulse shaper of FIG. 1.

In FIGS. 1 and 2, the voltage in the diagonal branch of the Wheatstone bridge 9 is tapped across a pair of operational amplifiers OP12/OP10 or, respectively, OP5/OP2, whereby the operational amplifier OP12 together with a transistor T65 and a operational amplifier OP2 together with the transistor T23 respectively form a constant voltage source, the operational amplifier OP10 with a transistor T71 and the operational amplifier OP5 together with a transistor T24, by contrast, operates as a constant current source by way of resistors of digital/analog converters 5, 6 for the leading and trailing edges of the pulses. It is achieved by the above measures that the constant current at the collectors of the transistors T24 or, respectively, T71 change only with respect to the shift voltage $U_{HUB}$, but are not influenced by the variation of the base voltage $U_{BASE-LINE}$. This is advantageous because, given variation of the shift voltage, the edge current should behave proportionally to the shift voltage according to $$J_{FL} = (U_{Hub} \cdot C_{T\;Konst})/t_{FL}$$

where $t_{FL}$ is the Edge Duration, $C_T$ is the capacitance of the capacitor $C_T$ and $J_{FL}$ is the charge current, if one wishes to obtain a shift-independent edge duration of the pulse. The basic value of the current-defining resistance $R_{VFL}/R_{RFL}$ therefore, is set by the digital/analog converters 5, 6; the shift-dependent current control occurs by way of the diagonal bridge voltages of the Wheatstone bridge 9 to be described in greater detail below. Pairs of transistors T67/T68 and T27/T28 form two differential current switches which are respectively supplied on their emitter side by way of the transistors T71 and T24 with the shift-dependent constant current.

The transistors T68 and T28 are alternately driven via a trigger pulse AJ, so that current flows either across the transistors T68 or across the transistor T28. This current charges a capacitor $C_T$ until one of two amplitude limiting diodes D12 or D34 becomes conductive and diverts the current towards constant voltage sources comprising components T70/OP9 or, respectively, T30/OP7. The above constant voltage sources are controlled across the resistors R89 and R148 directly by the pulse base voltage $U_{BASELINE}$ or, respectively, shift voltage $U_{HUB}$. Further, the error of the amplitude limiter voltage caused by the parasitic forward voltage of the limiter diodes D12 and D34 is identified by way of pairs of diodes D33 and D11 and is compensated by the operational amplifiers OP7 or, respectively, OP9.

This is possible because, in the final analysis, the same current flows through the diodes D33 and D11 as flows through the limiter diodes D12 and D34, the same forward voltage thus also occurs given diodes of the identical type. While by-passing the diodes D12 and D34, the transistors T67 and T27 see to it that the constant voltage sources with the transistors T30 or, respectively, T70 are always loaded with the same current during the switching intervals as in the limiting case. By so doing, undesired voltage fades given load jumps are largely avoided due to the finite internal resistance at the constant voltage sources with the transistors T30 and T70.

The pulse shaper signal E1 which has been completely edited as to its pulse parameters and as it arrives at the input of the output stage, now lies at the capacitor $C_T$. The output stage, for example, represents a bipolar voltage follower having the voltage transformation ratio 1:1.

It functions as an impedance converter.

When the trigger pulse is reversed (see FIG. 2), and when an input B58 is '1' and an input B59 is '0', then there applies $$J_c(T_1) = \frac{+45 + /ECL\;'0'U_{B59}/ - /U_{BE}(T_1)/}{R_2} \cdot \left(1 - \frac{1}{B_{T_1}}\right)$$

$B_{T_1}$ = Gain of the transistor $T_1$ $J_C(T_2) = 0$, because the transistor $T_2$ is not conducting $$J_C(T_{43}) = \frac{-30 + /U_{B58}/ + /U_{BE}(T_{43})}{R_{90}} \cdot \left(1 - \frac{1}{B_{T43}}\right)$$

$B_{T43}$ = Gain of the transistor $T_{43}$ $J_C(T_{42}) = 0$ because the transistor $T_{42}$ is not conducting By way of the voltage drop at a pair of resistors R83/R84 or, respectively, R132/R133, the above collector currents $J_C$ supply the differential drive signal for the transistors T26, T27, T28, T29 or, respectively, T66, T67, T68, T69. The voltage drop at the resistors R47 and R136 forms the offset.

There then applies the relationships:

$U_B(T_{26})/U_B(T_{27}) = U_E(T_{23}) - /J_c(T_{42})$ $(R_{47}+R_{83})/$ $U_B(T_{28})/U_B(T_{29}) = U_E(T_{23}) - /J_c(T_{43})$ $(R_{47}+R_{84})/$ $U_B(T_{66})/U_B(T_{67}) = U_E(T_{65}) + /J_c(T_1)$ $(R_{136}+R_{133})/$ $U_B(T_{68})/U_B(T_{69}) = U_E(T_{65}) + J_c(T_2)$ $(R_{136}+R_{133})/$ $U_B$ = Transistor Base voltage
$U_E$ = Transistor Emitter voltage The transistors T26 and T29 or, respectively, T66 and T69 respectively together form a differential current switch whose collector current is determined by the relationships:

$$J_C(T_{26}) = \frac{U_E(T_{23}) - /U_B(T_{26})/ - U_{BE}(T_{26})/}{R_{48}} \cdot \left(1 - \frac{1}{B_{T26}}\right)$$

$$J_c(T_{66}) = \frac{-U_E(T_{65}) + /U_B(T_{66})/ + /U_{BE}(T_{66})/}{R_{137}} \cdot \left(1 - \frac{1}{B_{T66}}\right)$$

The collector currents $J_c$ of the transistors T26 and (T66) cause a voltage drop $U_{R85} = J_c T_{66} \cdot R_{85}$ or, respectively, $U_{R134} = J_C(T_{26}) \cdot R_{134}$ at the resistors R85 and R134, the voltage drop serving to generate an additional, dynamic cut-off voltage (addition of the collector currents of the transistors T26/T27 or, respectively, T66/T67) at the diodes D12 and D34 in the case of transfer.

Were this measure not undertaken, then, in the limiting case, the respectively saturated, conductive limiting diode D12 or D34, given slow edge rise times (Δ small reversal currents for the capacitor $C_T$), would more quickly discharge the capacitor $C_T$ in the first moment upon transfer than is desired by means of the programmed reversal current, which would lead to a non-linear edge shape.

The semiconductor combination T27/T28 and T67/T68 is respectively interconnected with the transistors T24 and T74 to form a cascade stage, so that the following collector voltage derives:

$U_C(T_{24}) = U_B(T_{27}) + /U_{BE}(T_{27})/$ or
$U_B T_{28} + /U_{BE} T_{28}/$ $U_C(T_{74}) = U_B(T_{67}) - /U_{BE}(T_{67})/$ or
$U_B(T_{68}) - /U_{BE}(T_{68})/$

The transistors T24 and T71 respectively form constant current sources whose collector currents are determined by the relationships:

$$J_C(T_{24}) = \frac{/U_{OP2}3/ - /U_{OP5}3/}{R_{45}//R_{VFL}} \cdot \left(1 - \frac{1}{B_{T24}}\right)$$

Thereby:

$B_{T24}$ = Gain of the transistor $T_{24}$;
$U_{OP23}$ = Input voltage at the operational amplifier OP2 Pin 3;
$U_{OP53}$ = Input voltage at the operational amplifier OP5 Pin 3; and
$R_{VFL}$ = Program resistance of the digital-to-analog converter 5.

$$J_C(T_{71}) = \frac{/U_{OP123}/ - /U_{OP103}/}{R_{135}//R_{RFL}} \cdot \left(1 - \frac{1}{B(T_{71})}\right)$$

Thereby:

$B_{T71}$ = Gain of the transistor T71;
$U_{OP123}$ = Input voltage at the operational amplifier OP12 Pin 3;
$U_{OP103}$ = Input voltage at the operational amplifier OP10 Pin 3; and
$R_{RFL}$ = Programmed resistance of the digital-to-analog converter 6.

In the above equations, the differential voltages $U_O3 - U_{OP5}3$ or, respectively, $U_{OP12}3 - U_{OP10}3$ are respectively automatically followed independently of the shift, in contrast thereto, the programmable resistors $R_{VFL}$ and $R_{RFL}$ must be externally pre-set by the program as quasi-static basic values.

It is guaranteed by means of this re-adjustment that the edge current changes in the same measure relative to the shift voltage according to the relationship $t_{FL} = (U_{HUB} \cdot C_T)/J_{FL}$ $t_{FL}$ = edge duration; and
$J_{FL}$ = edge current.

As already mentioned, the outputs of the digital/analog converter 5, 6 function as resistors for the leading edge or, respectively, trailing edge programming. Since the programming occurs over ten bits, each digital/analog converter, abbreviated as DAU, contains 10 binarilly-staggered resistance values

DAU 5:
$R_7/R_{11}/R_{15}/R_{19}/R_{23}/R_{27}/R_{31}/R_{35}/R_{39}/R_{43}$

DAU 6:
$R_{94}/R_{98}/R_{102}/R_{106}/R_{110}/R_{114}/R_{118}/R_{122}/R_{126}/R_{130}$, which are switched on by the transistors:

DAU 5: $T_4/T_6/T_8/T_{10}/T_{12}/T_{14}/T_{16}/T_{18}/T_{20}/T_{22}$

DAU 6: $T_{45}/T_{47}/T_{49}/T_{51}/T_{53}/T_{55}/T_{57}/T_{59}/T_{61}/T_{63}$.

Further, each of the two digital/analog converters must be constructed floating because of the readjustment. This occurs by means of the transistors:

DAU 5: $T_3/T_5/T_7/T_9/T_{11}/T_{13}/T_{17}/T_{19}/T_{21}$

DAU 6:
T44/T46/T48/T50/T52/T54/T56/T58/T60/T62.
which respectively function as power source switches and thus reshape the OV-related input level of the TTL drive logic into a current shift of constant magnitude with, for example, $$J_C(T_3) = \frac{/U_{TTL}\text{'1'}/ - /U_{D1}/ - /U_{BE(T_3)}/}{R_5} \cdot \left(1 - \frac{1}{B_{T_3}}\right)$$

where $U_{tt1}$ '1' is the control voltage for a TTL circuit when the input is a binary "1".

This current serves as the base current for the transistor T4, so that the transistor T4 becomes saturated and becomes conductive except for the residual voltage $U_{CE}$. In the cut-off case, the resistors R4 and R6 clear the base charges in that they clamp the bases of the transistors T3 and T4 to emitter potential.

The level converters of the remaining digital/analog converter bits operate analogously. The digital/analog converters for the basic voltage 2 and for the shift voltage 1 exhibit a current source output whose output currents are binarilly weighted. Since the current source outputs must be loaded toward 0 volts, on the one hand, and, on the other hand, the currents must be converted into voltages with the necessary d.c. offset, it is necessary to insert a pair of operational amplifiers OP1 or, respectively, OP8, whose output voltage behaves as follows:

$U_{AOP1} = J_{ADAU} \cdot R_{78} + (12 \cdot R_{78})/R_{76}$ where $J_{ADAU}$ is the output current from the converter 1, and $$U_{AOP8} = J_{ADAU}(R_{151} + R_s) - \frac{12(R_{151} + R_s)}{R_{150} + R_B},$$

where $I_{ADAU}$ is the output current from the converter 2.

The output voltage of the operational amplifier OP8 can be directly employed as the pulse basic voltage, since the operational amplifier OP8 simultaneously operates as an impedance converter and the output voltage is therefore sufficiently loadable.

The output voltage of the operational amplifier OP1 serves as the control voltage for the constant current source comprising the operational amplifier OP3 and the transistor T25, for whose output current there applies:

$$J_C T_{25} = \frac{/U_K1/ - /U_{OP3}/}{R_{79}} \cdot \left(1 - \frac{1}{B_{T25}}\right)$$

Thereby:
$U_K1$ = output voltage of a constant voltage source K1
$U_{OP3}$ = input voltage at the operational amplifier OP3 Pin 3
$B_T25$ = gain of the transistor $T_{25}$ The collector current $J_c$ of the transistor T25 flows through the resistor R82 which is in turn connected to the pulse basic voltage. The voltage at the input of an operational amplifier OP6 is thus determined by the expression $U_{OP6}3 = U_{BASELINE} + J_C(T_{25}) \cdot R_{82}$ The operational amplifier OP6 operates as a voltage follower and an impedance converter; its output generates the shift voltage.

The output voltage of the constant voltage source K1 can be slightly changed by a potentiometer P1, whereby there is a possibility of setting the d.c. offset of the shift voltage relative to the pulse basic voltage. Basic voltage and shift voltage control two Wheatstone bridges whose diagonal voltages behave as follows:

$$U_{RVFL} = U_{HUB} + \frac{45 - /U_{HUB}/ - U_{ZD2}/}{R_{53} + R_{54}} \cdot R_{53} + /U_{ZD2}/ -$$

$$\left(U_{BASELINE} + \frac{45 - /U_{BASELINE}/ - U_{ZD1}/}{R_{51} + R_{52}} \cdot R_{51} + /U_{ZD1}/\right)$$

$$U_{RRFL} = U_{HUB} - \frac{30 - /U_{HUB}/ - /U_{ZD3}}{R_{144} + R_{145}} \cdot R_{144} - /U_{ZD3}/ -$$

$$\left(U_{BASELINE} - \frac{30 - /U_{BASELINE}/ - /U_{ZD4}/}{R_{146} + R_{143}} \cdot R_{143} - /U_{ZD4}/\right)$$

The above voltages respectively serve as guidance voltages for the edge current sources. The effects of temperature of the components are compensated by the arrangement of the components in a bridge circuit since the guidance voltages arise differentially.

By way of the resistors R89 and R148, respectively, the pulse voltage and the shift voltage directly control a respective constant voltage source comprising the components OP7/T30 or, respectively, OP9/T70. These two voltage sources generate the limiting voltages for the amplitude limiting diodes D12 and D34. After the limiter current either flows across the resistor R85 and the diode D12, or across the resistor 134 and the diode D34, there occurs an error with respect to the limiting voltage of:

$U_{FHubbegr.} = J_C(T_{28}) \cdot R_{134} + /U_{D34}$ $U_{FBasisbegr.} = J_C(T_{68}) \cdot R_{85} + /U_{D12}$ This error is compensated in that the same error voltage drop is intentionally generated at the resistor/diode combinations R44/D11 or, respectively, R131/D33 (the same limiter current flows through these components), and is communicated in equiphase to the inputs of the operational amplifier OP9 or, respectively, OP7 by an inverse feedback, via the resistors R87/R88 or, respectively, R142/R149. The operational amplifiers thereby automatically adjust the respective limiting voltage by the amount of the error. The capacitors C4, C5, C6, C10, C11, C12, C13, C14 serve for frequency compensation; they prevent an oscillation given re-programming of the limiting voltages.

The guidance voltages for the power supply of the output stage are tapped behind the Zener diodes ZD2 and ZD4.

Figure 3:
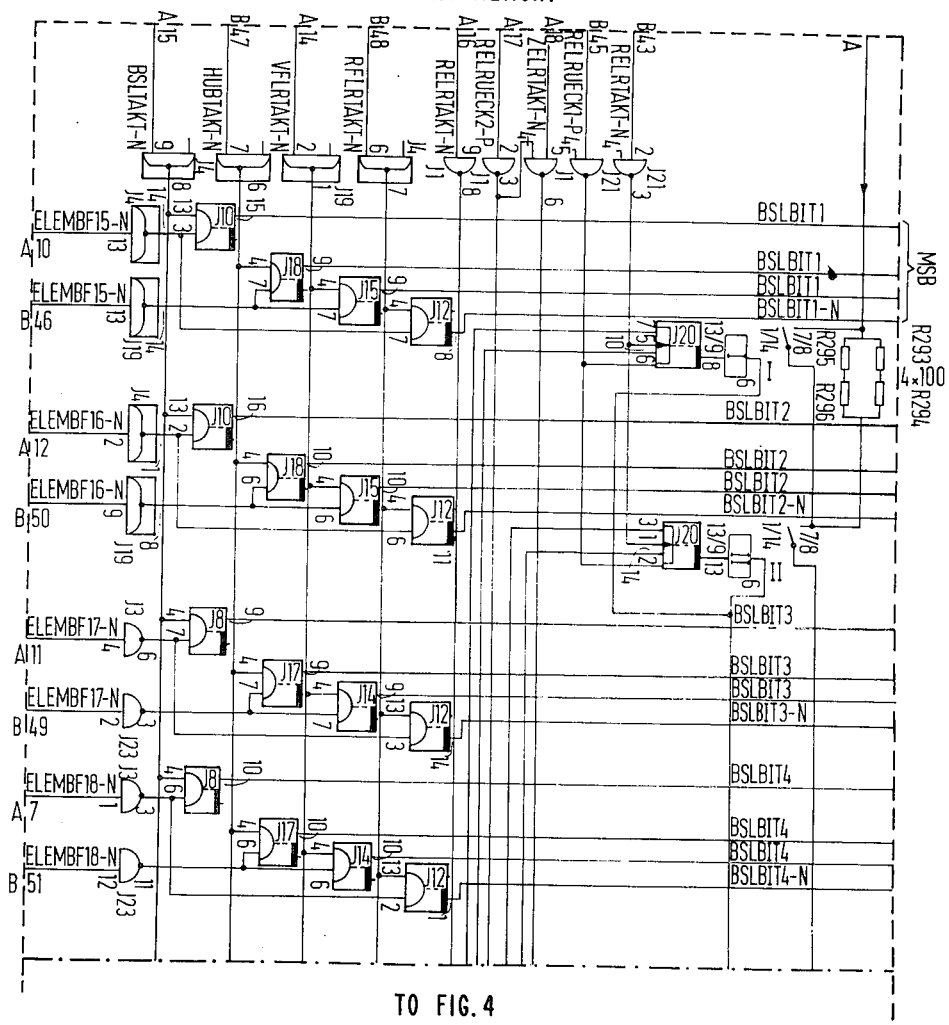
FIGS. 3 and 4 together form a logic portion for the pulse shaper.
Figure 4:
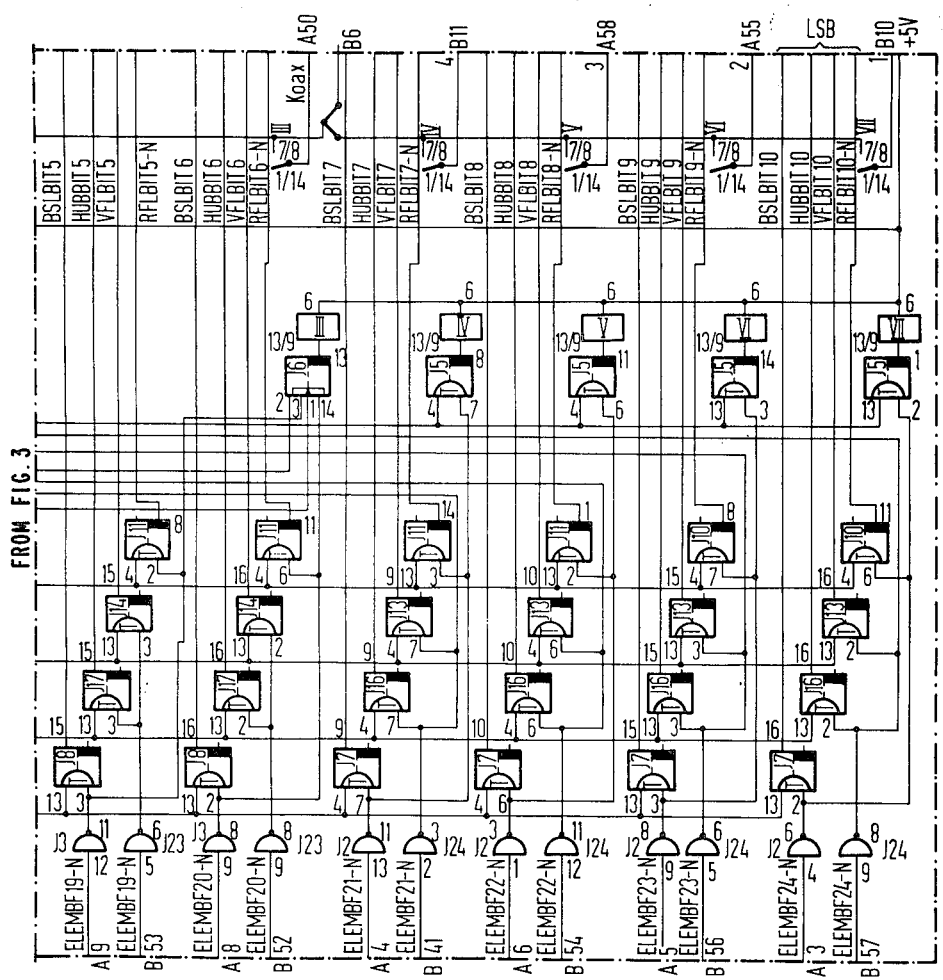

FIGS. 3 and 4 illustrate the digital portion 3, 4, 7, 8 of the pulse shaper. The parameter data arrive in parallel at the preparation inputs of the D-flip flops J7, J8, J10–J18 via the inputs A3–A12, B41, B46, B49–B54, B56, B57 and by way of the inverter gates J2, J3, J4, J19, J23, J24.

A transfer clock (at the inputs A14, A15, B47, B48) now controls ten repective parallel clodk inputs of the above D-flip-flops by a power inverter, the outputs of the D-flip-flops leading directly to the corresponding DAU's in the analog portion. So that the parameter data are properly accepted into the flip-flops, it is necessary that the respective transfer clock be no narrower than 20 ns and that a minimum preparation time of 20 ns of the parameter data with respect to the negative edge of the transfer clock not be fallen below.

The change-over of the output resistance occurs via a relay I driven by the flip-flop J20. Given simultaneous activation of ELEMBF21-N and RELRTAKT-N, the flip-flop J20 is set, which effects the output resistance ≦3Ω. Given simultaneous activation of ELEMBF22-N and RELRTAKT-N, the flip-flop J20 is reset, whereby the output resistance 100Ω is switched on.

The pulse shaper output is fundamentally switched on or off with the relay II via the flip-flop J20. For this purpose, either ELEMBF21-N and RELRTAKT-N must be activated, which means connection of the pulse shaper output, or ELEMBF24-N and RELRTAKT-N must be activated, which means disconnection of the pulse shaper output.

Both flip-flops J20 are reset independent of the programming by a reset signal RELRUECK1-P, i.e. the pulse shaper output resistance Δ100Ω and the pulse shaper output are switched off.

The output pulse is distributed to five mutually independent output pins A50, B11, A58, A55 and B10 by the relays III, IV, V, VI and VII. The above relays are controlled by the flip-flops J5 and J6, whereby the flip-flops J5 (D-flip-flop) accept the information of ELEMBF-21N–ELEMBF-24N via the transfer clock ZELRTAKT-N, in contrast whereto the flip-flops J6 is set or, respectively, reset by ELEMBF19-9, or respectively, ELEMBF20-N in coincidence to RELRTAKT-N. Further, the flip-flop J6 can also be reset independently of the programming via RELRUECK2-P.

Although I have described my invention by reference to particular illustrative embodiments thereof, many changes and modifications of the invention may become apparent to those skilled in the art without departing from the spirit and scope of the invention. I therefore intend to include within the patent warrented hereon all such changes and modifications as may reasonably and properly be included within the scope of my contribution to the art.

I claim:

1. A pulse shaper comprising:
an input for receiving periodic input pulses;
a data bus for carrying binary signals which define pulses to be formed;
a capacitor to be periodically reversibly charged for forming shaped pulses;
first and second mutually symmetrical circuits connected to reversibly charge said capacitor, said symmetrical circuits connected to said data bus and respectively comprising first and second binarily switched resistance means for setting the rise times and fall times and thereby defining a voltage shift of the pulses to be formed in response to the binary signals, respective first and second constant current sources and respective first and second constant voltage sources connected to and controlled by the respective constant current sources and said first and second binarily switched resistance means for providing a proportional change of the edge steepness with respect to a change of the defined voltage shift of the pulses to be formed, and first and second voltage limitation means connected to said first and second constant voltage sources and including respective variable bias voltage sources for setting bias voltages for said first and second voltage limitation means in accordance with the defined voltage shift of the pulses to be formed; and
periodically operated differential switching means connected to said input and to said symmetrical circuits and said capacitor and operable in response to the input pulses to connect and disconnect said first and second symmetrical circuits and said capacitor.

2. The pulse shaper of claim 1, and further comprising:
first and second data bus sections in said data bus for receiving parameter data for defining the pulses to be formed; and
first and second memories respectively connected to the data bus sections for storing the parameter data;
and wherein each of said binarily switched resistance means constitutes a digital/analog converter connected between the respective memory and the respective constant current and constant voltage sources.

3. The pulse shaper of claim 2, and further comprising:
third and fourth memories respectively connected to said first and second data bus sections to receive and store the parameter data;
third and fourth digital/analog converters respectively connected to and driven by said third and fourth memories to provide respective output signals; and
first and second operational amplifiers respectively connected to and driven by said third and fourth digital/analog converters for establishing pulse shift and baseline voltages for the pulses to be produced.

4. The pulse shaper of claim 3, wherein:
each of said memories a flip-flop memory.

5. The pulse shaper of claim 3, and further comprising:
a transistor connected to the output of said first operational amplifier and therewith forming a third constant current source;
an ohmic resistor connecting the outputs of said first and second operational amplifiers via said transistor.

6. The pulse shaper of claim 5, and further comprising:
a third operational amplifier connected to and driven by said first operational amplifier; and
a Wheatstone bridge circuit including first and second diagonals, said first diagonal connected to said third operational amplifier and said second diagonal connected to said second operational amplifier.

7. The pulse shaper of claim 6, wherein:
said Wheatstone bridge comprises a plurality of branches each including a voltage divider.

8. The pulse of claim 7, wherein:
each of said first and second constant voltage sources is an emitter follower and comprises an operational amplifier connected to a respective voltage divider, and a transistor connected to the output of the operational amplifier.

9. The pulse shaper of claim 8, wherein:

each of said first and second constant current sources comprises an operational amplifier connected to a respective voltage divider which is not connected to a voltage source operational amplifier, and a transistor connected to the output of the current source operational amplifier.

10. The pulse shaper of claim 9, wherein:

each of said voltage limitation means comprises a Zener diode connected to said switching means and to said capacitor, and a transistor connected to said Zener diode and an operational amplifier connected to drive said transistor forming therewith the respective bias voltage source as an emitter follower, said operational amplifier including control inputs connected to respective taps of a respective voltage divider of said Wheatstone bridge.

11. The pulse shaper of claim 10, wherein:

said differential switching means comprises first, second, third and fourth transistors each including a base, an emitter and a collector, said first and second transistors being of one conductivity type and said third and fourth transistors being complementary thereto, said collectors of said second and fourth transistors connected together to said capacitor and to said Zener diodes, and said collectors of said first and third transistors connected to respective voltage sources.

12. A pulse shaper for forming test pulses in response to input pulses and binary signals, comprising:

input means for receiving input pulses;

a data bus for carrying binary signals which define the parameters of a test pulse to be produced;

a capacitor to be periodically reversibly charged for forming shaped test pulses;

first and second mutually symmetrical circuits connected to said capacitor, to said input means and to said data bus for charging and discharging said capacitor in response to input pulses and binary signals, said circuits respectively comprising first and second digital/analog converters connected to said data bus and operable to set the rise times and fall times and thereby define a voltage shift of the pulses to be formed in response to the binary signals, respective first and second constant current sources and respective first and second constant voltage sources connected to and controlled by the respective constant current sources and digital/analog converters for providing a proportional change of edge steepness with respect to the defined voltage shift of the pulses to be formed, and first and second voltage limitation means connected to said first and second constant voltage source and including respective variable bias voltage sources for setting bias voltages for said first and second voltage limitation means in accordance with the defined voltage shift of the pulses to be formed; and periodically operated differential switching means connected to said input means and to said symmetrical circuits and said capacitor and operable in response to the input pulses to selectively connect and disconnect said first and second symmetrical circuits and said capacitor.

* * * * *